(12) United States Patent
Ziv et al.

(10) Patent No.: US 12,111,352 B2
(45) Date of Patent: Oct. 8, 2024

(54) MACHINE LEARNING FOR SYNCING MULTIPLE FPGA PORTS IN A QUANTUM SYSTEM

(71) Applicant: Quantum Machines, Tel Aviv (IL)

(72) Inventors: Avishai Ziv, Tel Aviv (IL); Ori Weber, Tel Aviv (IL); Nissim Ofek, Tel Aviv (IL)

(73) Assignee: Quantum Machines (IL)

( * ) Notice: Subject to any disclaimer, the term of this patent is extended or adjusted under 35 U.S.C. 154(b) by 369 days.

(21) Appl. No.: 17/582,207

(22) Filed: Jan. 24, 2022

(65) Prior Publication Data
US 2023/0236244 A1    Jul. 27, 2023

(51) Int. Cl.
*G01R 31/317* (2006.01)
*G06N 10/20* (2022.01)
*G06N 10/60* (2022.01)

(52) U.S. Cl.
CPC . *G01R 31/31703* (2013.01); *G01R 31/31712* (2013.01); *G06N 10/20* (2022.01); *G06N 10/60* (2022.01)

(58) Field of Classification Search
None
See application file for complete search history.

(56) References Cited

U.S. PATENT DOCUMENTS

| 4,875,484 | A | 10/1989 | Anzai et al. |
| 5,063,354 | A | 11/1991 | Lauper et al. |
| 5,194,907 | A | 3/1993 | Hayashi |
| 6,223,228 | B1 | 4/2001 | Ryan et al. |
| 6,426,984 | B1 | 7/2002 | Perino et al. |
| 6,993,108 | B1 | 1/2006 | Chi et al. |
| 7,127,022 | B1* | 10/2006 | Dieguez ............... H03L 7/0807 327/158 |
| 7,451,292 | B2 | 11/2008 | Routt |
| 7,535,931 | B1 | 5/2009 | Zampetti et al. |
| 7,627,126 | B1 | 12/2009 | Pikalo |

(Continued)

FOREIGN PATENT DOCUMENTS

| CA | 2420022 | 2/2003 |
| CN | 104467843 | 3/2015 |

(Continued)

OTHER PUBLICATIONS

Lavoie et al., "A Formalization for Specifying and Implementing Correct Pull-Stream Modules," in arXiv preprint arXiv:1801.06144 (2018). (Year: 2018).

(Continued)

*Primary Examiner* — Lina Cordero
(74) *Attorney, Agent, or Firm* — McAndrews, Held & Malloy, Ltd.

(57) ABSTRACT

In a quantum computer, quantum algorithms are performed by a qubit interacting with multiple quantum control pulses. The quantum control pulses are electromagnetic RF signals that are generated digitally at baseband and sent, via asynchronous ports, to DACs that feed an RF upconversion circuit. For synchronization, each asynchronous port is coupled to a multi-tap delay line. The setting of the multi-tap delay line is determined by a function of the port's setup-and-hold time. This function is trained, via machine learning, to be applicable across a variety of ports.

20 Claims, 5 Drawing Sheets

(56) References Cited

U.S. PATENT DOCUMENTS

| | | | |
|---|---|---|---|
| 8,315,969 B2 | 11/2012 | Roetteler | |
| 8,385,878 B2 | 2/2013 | Rao | |
| 8,750,717 B1 | 6/2014 | Yap et al. | |
| 9,207,672 B2 | 12/2015 | Williams | |
| 9,400,499 B2 | 7/2016 | Williams | |
| 9,509,324 B2 | 11/2016 | McDonald et al. | |
| 9,663,358 B1 | 5/2017 | Cory et al. | |
| 9,692,423 B2 | 6/2017 | McDermott, III | |
| 9,847,121 B2 | 12/2017 | Frank | |
| 9,858,531 B1 | 1/2018 | Monroe | |
| 9,892,365 B2 | 2/2018 | Rigetti | |
| 9,978,020 B1 | 5/2018 | Gambetta | |
| 9,979,400 B1 | 5/2018 | Sete | |
| 9,996,801 B2 | 6/2018 | Shim | |
| 10,063,228 B2 | 8/2018 | Deurloo et al. | |
| 10,122,351 B1 | 11/2018 | Naaman | |
| 10,127,499 B1 | 11/2018 | Rigetti | |
| 10,192,168 B2 | 1/2019 | Rigetti | |
| 10,223,643 B1 | 3/2019 | Bishop et al. | |
| 10,333,503 B1 | 6/2019 | Cohen et al. | |
| 10,454,459 B1 | 10/2019 | Cohen | |
| 10,496,069 B2 | 12/2019 | Nazarathy et al. | |
| 10,505,524 B1 | 12/2019 | Cohen | |
| 10,560,076 B1 | 2/2020 | Cohen | |
| 10,637,449 B1 | 4/2020 | Cohen et al. | |
| 10,659,018 B1 | 5/2020 | Cohen | |
| 10,666,238 B1 | 5/2020 | Cohen | |
| 10,958,253 B1 | 3/2021 | Cohen et al. | |
| 10,985,739 B2 | 4/2021 | Cohen et al. | |
| 11,010,145 B1 | 5/2021 | Smith et al. | |
| 11,463,075 B2 | 10/2022 | Cohen et al. | |
| 11,616,497 B2 | 3/2023 | Cohen et al. | |
| 11,616,498 B2 | 3/2023 | Cohen et al. | |
| 2002/0004876 A1 | 1/2002 | Timmer et al. | |
| 2004/0266084 A1 | 12/2004 | Fujishima et al. | |
| 2005/0015422 A1 | 1/2005 | Kohn et al. | |
| 2005/0180575 A1 | 8/2005 | Maeda et al. | |
| 2006/0093376 A1 | 5/2006 | Mitchell et al. | |
| 2008/0037693 A1 | 2/2008 | Andrus et al. | |
| 2010/0072979 A1 | 3/2010 | Fefer et al. | |
| 2011/0035511 A1 | 2/2011 | Biederman | |
| 2013/0198499 A1 | 8/2013 | Dice et al. | |
| 2016/0125311 A1 | 5/2016 | Fuechsle et al. | |
| 2016/0267032 A1 | 9/2016 | Rigetti et al. | |
| 2016/0292586 A1 | 10/2016 | Rigetti et al. | |
| 2017/0094618 A1 | 3/2017 | Bjorkengren | |
| 2017/0214410 A1 | 7/2017 | Hincks et al. | |
| 2017/0364796 A1 | 12/2017 | Wiebe | |
| 2018/0013426 A1 | 1/2018 | Deurloo et al. | |
| 2018/0032893 A1 | 2/2018 | Epstein | |
| 2018/0091244 A1 | 3/2018 | Abdo | |
| 2018/0107579 A1 | 4/2018 | Chapman | |
| 2018/0123597 A1 | 5/2018 | Sete | |
| 2018/0237039 A1 | 8/2018 | Mong et al. | |
| 2018/0260245 A1 | 9/2018 | Smith | |
| 2018/0260730 A1 | 9/2018 | Reagor | |
| 2018/0260732 A1 | 9/2018 | Bloom | |
| 2018/0308007 A1 | 10/2018 | Amin | |
| 2018/0322409 A1 | 11/2018 | Barends | |
| 2018/0365585 A1 | 12/2018 | Smith | |
| 2018/0373995 A1 | 12/2018 | Tomaru et al. | |
| 2018/0375650 A1 | 12/2018 | Legre | |
| 2019/0042964 A1 | 2/2019 | Elsherbini et al. | |
| 2019/0042965 A1 | 2/2019 | Clarke | |
| 2019/0042970 A1 | 2/2019 | Zou | |
| 2019/0042971 A1 | 2/2019 | Zou | |
| 2019/0042972 A1 | 2/2019 | Zou | |
| 2019/0042973 A1 | 2/2019 | Zou | |
| 2019/0049495 A1 | 2/2019 | Ofek | |
| 2019/0251478 A1 | 8/2019 | Bishop et al. | |
| 2019/0266512 A1 | 8/2019 | Shen et al. | |
| 2019/0302832 A1 | 10/2019 | Morgan et al. | |
| 2019/0317589 A1 | 10/2019 | Mathur et al. | |
| 2019/0385088 A1 | 12/2019 | Naaman et al. | |
| 2020/0293080 A1 | 9/2020 | Poon et al. | |
| 2020/0364602 A1 | 11/2020 | Niu et al. | |
| 2021/0004707 A1 | 1/2021 | Gambetta et al. | |
| 2021/0103847 A1 | 4/2021 | Akzam | |
| 2021/0125096 A1 | 4/2021 | Puri et al. | |
| 2021/0359670 A1 | 11/2021 | Cohen et al. | |

FOREIGN PATENT DOCUMENTS

| | | | |
|---|---|---|---|
| CN | 105281886 A | 1/2016 | |
| CN | 105912070 A | 8/2016 | |
| CN | 108111306 A | 6/2018 | |
| CN | 108594214 | 9/2018 | |
| CN | 110085094 A | 8/2019 | |
| CN | 110677210 | 1/2020 | |
| CN | 111464154 | 7/2020 | |
| CN | 111767055 A | 10/2020 | |
| CN | 112019193 | 12/2020 | |
| CN | 112149832 A | 12/2020 | |
| EP | 0388052 | 9/1990 | |
| JP | 2011175078 A | 9/2011 | |
| JP | 2012188875 | 10/2012 | |
| WO | WO-0229975 A2 * | 4/2002 | ............... G06F 1/10 |
| WO | 2015178991 A2 | 11/2015 | |
| WO | 2015178992 A2 | 11/2015 | |
| WO | 2017078735 A1 | 5/2017 | |
| WO | 2017123940 | 7/2017 | |
| WO | 2017139683 A1 | 8/2017 | |
| WO | 2018055607 | 3/2018 | |
| WO | 2018062991 A1 | 4/2018 | |
| WO | 2019063117 A1 | 4/2019 | |
| WO | 2020033807 A1 | 2/2020 | |
| WO | 2020231795 A1 | 11/2020 | |
| WO | 2021/123903 | 6/2021 | |

OTHER PUBLICATIONS

Fu et al., "A Microarchitecture for a Superconducting Quantum Processor," in 38.3 I EEE Micro 40-47 (2018). (Year: 2018).
Extended European Search Report Appln No. 20845965.1 dated Jun. 29, 2023.
European Office Communication with extended Search Report Appln No. 20861242.4 dated Jul. 7, 2023.
European Office Communication with extended Search Report Appln No. 23153085.8 dated Jul. 3, 2023.
Yang Yet al: "FPGA-based electronic system for the control and readout of superconducting qubit systems", arxiv.org, Cornell University Library, 201 Yang Yet al: "FPGA-based electronic system for the control and readout of superconducting qubit systems", arxiv.org, Cornell University Library, 201 Olin Library Cornell University Ithaca, NY 14853, Oct. 15, 2021 (Oct. 15, 2021), XP091078848.
Gebauer Richard et al: "A modular RFSoC-based approach to interface superconducting quantum bits", 2021 International Conference on Field-Programmable Technology (ICFPT), IEEE, Dec. 6, 2021 (Dec. 6, 2021), pp. 1-9, XP034028257, DOI: 10.1109/ICFPT52863.2021.9609909 [retrieved on Nov. 8, 2021].
Int'l Preliminary Report on Patentability Appln No. PCT/IB2020/000555 mailed Feb. 10, 2022.
Int'l Preliminary Report on Patentability Appln No. PCT/IB2020/000707 mailed Mar. 17, 2022.
Int'l Preliminary Report on Patentability Appln No. PCT/IB2020/000704 mailed Mar. 17, 2022.
Int'l Preliminary Report on Patentability Appln No. PCT/IB2020/000760 mailed Apr. 7, 2022.
Int'l Search Report and Written Opinion Appln No. PCT/IB2022/050190 mailed Apr. 11, 2022.
U.S. Appl. No. 62/294,966, filed Feb. 12, 2016.
Int'l Search Report and Written Opinion Appln No. PCT/IB2019/001410 mailed Jun. 10, 2020.
Int'l Search Report and Written Opinion Appln No. PCT/IB2019/001394 mailed Jun. 17, 2020.
Zhang J, Hegde SS, Suter D. Pulse sequences for controlled 2- and 3-qubit gates in a hybrid quantum register. arXiv preprint arXiv:1806.08408. Jun. 21, 2018.

(56) References Cited

OTHER PUBLICATIONS

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.
Int'l Search Report and Written Opinion Appln No. PCT/IB2020/000218 mailed Aug. 11, 2020.
Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).
Int'l Search Report and Written Opinion Appln No. PCT/IB2020/000376 mailed Sep. 17, 2020.
Breitfelder et al. eds., IEEE 100: The Authoritative Dictionary of IEEE Standards Terms 1247, definition 2 of "variable" (7th ed. 2000). (Year: 2000).
Int'l Search Report and Written Opinion Appln No. PCT/IB2020/000707 mailed Jan. 12, 2021.
National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4 , pp. 30, 57.
IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 mailed Jan. 17, 2021.
Wolfowicz, et al. Pulse Techniques for Quantum Information Processing University of Chicago, University College London, eMagRes, 2016, vol. 5: 1515-1528. DOI 10.1002/9780470034590.emrstm1521.
Int'l Search Report and Written Opinion Appln No. PCT/IB2020/000555 mailed Dec. 27, 2020.
Int'l Search Report and Written Opinion Appln No. PCT/IB2020/000760 mailed Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: <https://arxiv.org/pdf/1710.04645.pdf> McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 mailed May 13, 2021.
Int'l Preliminary Report on Patentability Appln No. PCT/IB2019/001410 mailed Jun. 10, 2021.
Int'l Search Report and Written Opinion Appln No. PCT/IB2021/000067 mailed Jun. 21, 2021.
Int'l Preliminary Report on Patentability Appln No. PCT/IB2019/001394 mailed Jul. 29, 2021.
Int'l Preliminary Report on Patentability Appln No. PCT/IB2020/000218 mailed Sep. 16, 2021.
Int'l Preliminary Report on Patentability Appln No. PCT/IB2020/000376 mailed Nov. 12, 2021.
Int'l Search Report and Written Opinion Appln No. PCT/IB2021/056254 mailed Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Extended European Search Report Appln No. 19889443.8 dated Aug. 4, 2022.
Int'l Search Report and Written Opinion Appln No. PCT/IB2022/054903 mailed Sep. 8, 2022.
Int'l Preliminary Report on Patentability Appln No. PCT/IB2021/000067 mailed Sep. 22, 2022.
Int'l Search Report and Written Opinion Appln No. PCT/IB2022/053304 mailed Oct. 6, 2022.
Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.
Extended European Search Report Appln No. 19910800.2 dated Oct. 6, 2022.
Hornibrook J M et al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.
Fu X et al: "An Experimental Microarchitecture for a Superconducting Quantum Processor", MICRO-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.
Zopes J. et al: "High resolution quantum sensing with shaped control pulses", arxiv.org, Cornell University Library, 201 Olin Library Cornell University Ithaca, NY 14853, May 22, 2017 (May 22, 2017), XP081276850.
Cross et al. "Open Quantum Assembly Language", Jan. 10, 2017.
European Office Communication with extended Search Report Appln No. 20766036.6 dated Nov. 24, 2022.
Japanese Patent Office Action Appln No. 2021-529723 dated Oct. 26, 2022 with translation.
Int'l Search Report and Written Opinion Appln No. PCT/IB2022/000059 mailed Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 mailed Jun. 30, 2022.
Int'l Search Report and Written Opinion Appln No. PCT/IB2022/000024 mailed Jul. 18, 2022.
Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).
Int'l Search Report and Written Opinion Appln No. PCT/IB2022/000068 mailed Jul. 17, 2022.
D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).

* cited by examiner

MACHINE LEARNING FOR SYNCING MULTIPLE FPGA PORTS IN A QUANTUM SYSTEM

BACKGROUND

Limitations and disadvantages of the conventional use of multiple FPGA ports will become apparent to one of skill in the art, through comparison of such approaches with some aspects of the present method and system set forth in the remainder of this disclosure with reference to the drawings.

BRIEF SUMMARY

Methods and systems are provided for syncing multiple FPGA ports in a quantum system, substantially as illustrated by and/or described in connection with at least one of the figures, as set forth more completely in the claims.

DETAILED DESCRIPTION

Figure 1:
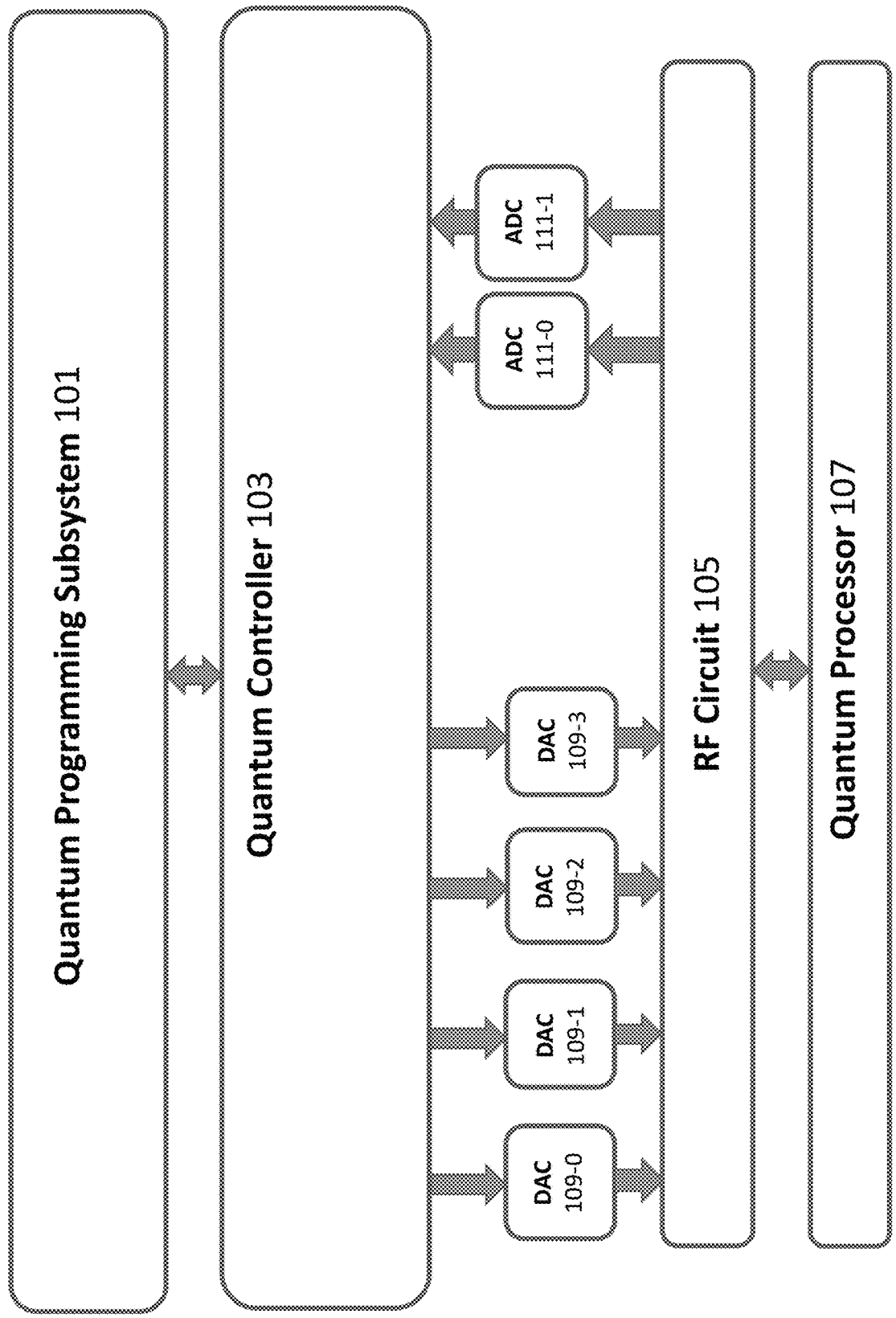
FIG. 1 illustrates an example quantum system comprising multiple FPGA ports that are synced in accordance with various example implementations of this disclosure.

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Logical operations in classical computers are performed on fixed states. For example, at time 0 a bit is in a first state, at time 1 a logic operation is applied to the bit, and at time 2 the bit is in a second state as determined by the state at time 0 and the logic operation. The state of a bit is typically stored as a voltage (e.g., 1 Vdc for a "1" or 0 Vdc for a "0"). The logic operation typically comprises of one or more transistors.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle+\beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. The basis states $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively. The qubit state may represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers. In fact, some problems that are intractable for classical computers may become trivial for quantum computers.

Unlike a classical bit, a qubit cannot be stored as a single voltage value on a wire. Instead, a qubit is physically realized using a two-level quantum mechanical system. For example, at time 0 a qubit is described as $$\begin{bmatrix}\alpha_1\\\beta_1\end{bmatrix},$$

at time 1 a logic operation is applied to the qubit, and at time 2 the qubit is described as $$\begin{bmatrix}\alpha_2\\\beta_2\end{bmatrix}.$$

Many physical implementations of qubits have been proposed and developed over the years. Some examples of qubits implementations include superconducting circuits, spin qubits, and trapped ions.

FIG. 1 illustrates an example quantum system comprising multiple FPGA ports that are synced in accordance with various example implementations of this disclosure. The quantum system comprise a quantum programming subsystem (QPS) 101, a quantum controller (QC) 103, and a quantum processor 107.

The QPS 101 is capable of generating a quantum algorithm description which configures the QC 103 and includes instructions the QC 103 can execute to carry out the quantum algorithm (i.e., generate the necessary outbound quantum control pulse(s)) with little or no human intervention during runtime. In an example implementation, the QPS 101 is a personal computer comprising a processor, memory, and other associated circuitry (e.g., an x86 or x64 chipset). The QPS 101 compiles the high-level quantum algorithm description to a machine code version of the quantum algorithm description (i.e., series of binary vectors that represent instructions that the QC 103 can interpret and execute directly).

The QPS 101 may be coupled to the QC 103 via an interconnect which may, for example, utilize a universal serial bus (USB), a peripheral component interconnect (PCIe) bus, wired or wireless Ethernet, or any other suitable communication protocol.

The QC 103 comprises circuitry operable to load the machine code quantum algorithm description from the QPS 101 via the interconnect. Execution of the machine code by the QC 103 causes the QC 103 to generate the necessary outbound quantum control pulse(s) that correspond to the desired operations to be performed on the quantum processor 107 (e.g., sent to qubit(s) for manipulating a state of the qubit(s) or to readout resonator(s) for reading the state of the qubit(s), etc.). The machine code may also cause the QC 103 to perform an analysis on an input signal. The analysis result may be used to determine the state of the qubit or the quantum register (quantum measurement). Depending on the quantum algorithm to be performed, outbound pulse(s) for carrying out the algorithm may be predetermined at design time and/or may need to be determined during runtime. The runtime determination of the pulses may comprise performance of classical calculations and processing in the QC 103 during runtime of the algorithm (e.g., runtime analysis of inbound pulses received from the quantum processor).

A QC 103 generates the precise series of external signals, usually pulses of electromagnetic waves and pulses of base band voltage, to perform the desired logic operations (and thus carry out the desired quantum algorithm).

During runtime and/or upon completion of a quantum algorithm performed by the QC 103, the QC 103 may output data/results to the QPS 101. In an example implementation these results may be used to generate a new quantum algorithm description for a subsequent run of the quantum algorithm and/or update the quantum algorithm description during runtime. Additionally, the QC 103 may output the raw or processed inbound pulses received from the quantum processor 107, representing qubits state estimation, or metadata representing the quantum program control flow and branching information, as well as internal variables computations during the program execution.

A QC 103 comprises a plurality of pulse processors, which may be implemented in a field programmable gate array (FPGA), an application specific integrated circuit or the like. A pulse processor is operable to control analog outbound pulses that drive a quantum element (e.g., one or more qubits and/or resonators) or allow interaction between quantum elements and digital outbound pulses that can control auxiliary equipment required for the program execution (e.g., gating the analog outbound pulses or controlling external devices like photon detectors).

Quantum algorithms are performed in the quantum processor 107 when one or more qubits interact with quantum control pulses. These quantum control pulses are electromagnetic RF signals or pulses that are generated digitally at baseband in the QC 103, converted to an analog waveform via a plurality of DACs 109-0, 109-1, 109-2 and 109-3, and upconverted by an RF circuit 105. The desired signals may be generated according to a known set of instructions, involving various operations such as arithmetical or logical calculations, communication with various components and classical control flow operations (jump, branch, etc.). An application layer (APP) in the QC 103 controls a physical layer (PHY) to digitally generate (and further modify) samples of this analog waveform. Inbound pulses are also received by the QC 103, from the quantum processor 107, via the RF circuit 105 and a plurality of ADCs 111-0 and 111-1.

A qubit may have a life in the range of hundreds of microseconds, causing a very low program execution runtime. Also, in data centers where a quantum computer is acting as a co-accelerator for specific computations there may be thousands of programs that are queuing to use the designated quantum processor 107.

As the process, voltage and temperature (PVT) changes, a periodic recalibration may be in order. Therefore, a fast, robust and independent approach to recalibration may facilitate a much better usage of the quantum computer while minimizing dead time between programs.

Figure 2:
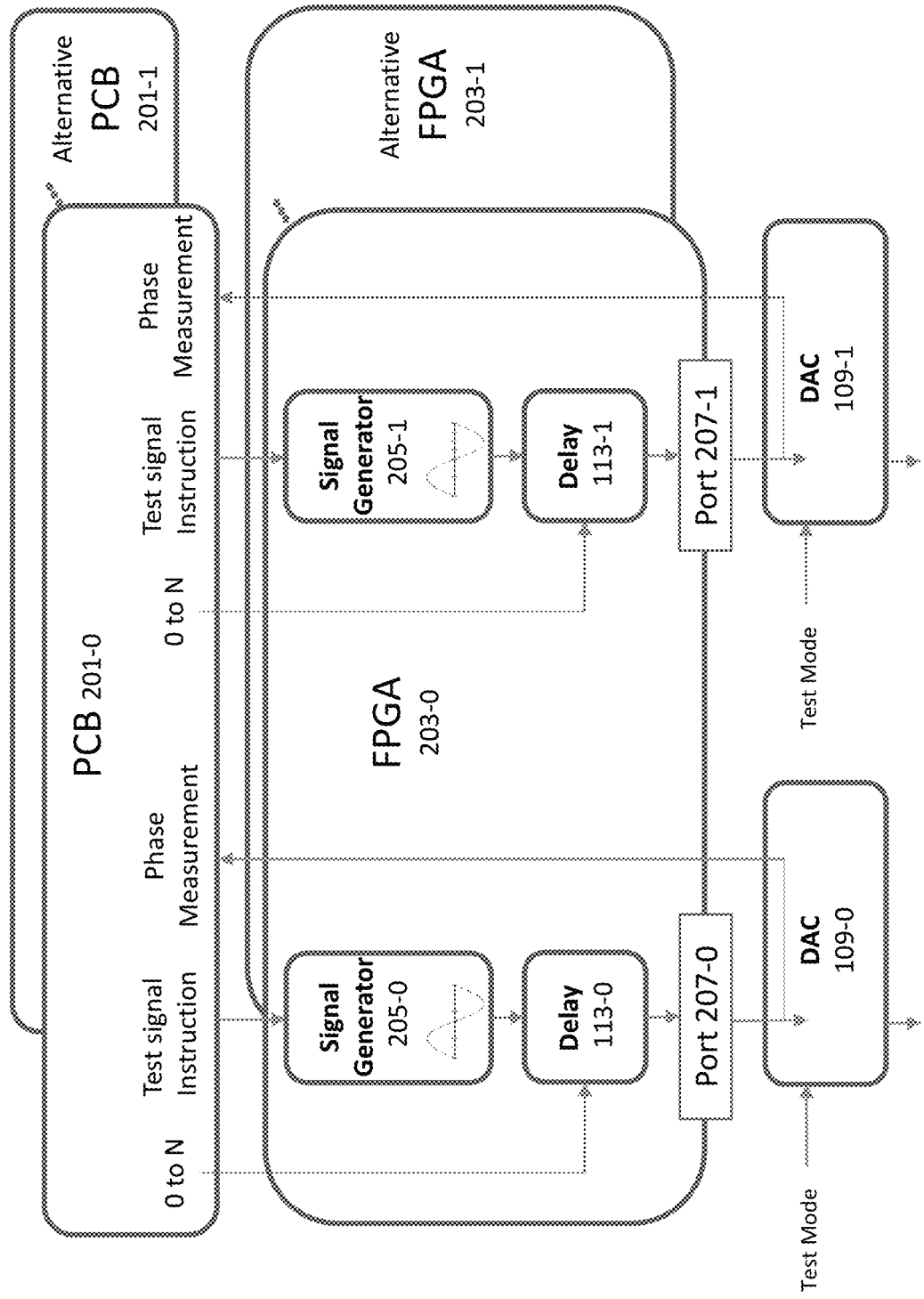
FIG. 2 illustrates an example system for training a quantum system to sync multiple FPGA ports in accordance with various example implementations of this disclosure.

FIG. 2 illustrates an example system for training a quantum system to sync multiple FPGA ports in accordance with various example implementations of this disclosure.

The quantum controller 103 in FIG. 1 may comprise a PCB 201-0 and an FPGA 203-0. FPGA 203-0 may have numerous ports 207-0 and 207-1 which need to be synced to one another. Furthermore, the PCB 201-0 and FPGA 203-0 may have design variations 201-1 and 203-1, respectively, such that transmission via ports 207-0 and 207-1 of FPGA 203-0 may not be aligned with transmission via ports 207-0 and 207-1 of FPGA 203-1. Synchronization is required for the outputs, driven from FPGA 203-0 or 203-1, to arrive at all DACs 109-0 and 109-1 simultaneously and independently, without skews regardless of the design variations between similar system components. Any delay or misalignment of one of the signals that are being output from the FPGA 203-0 or 203-1 can drastically impair the reliability of the quantum computer.

The hardware path from the FPGA 203-0 to the ports 207-0 and 207-1 may change because of variants in FPGAs 203-1 (e.g., same PCB 201-0 revision, but an FPGA 203-1 from a different batch). The various characteristics of the FPGA 203-1 can influence the time that it takes the signal to arrive at a DAC 109-0 and 109-1 and ruin the sync that was calibrated for a different PCB 201. For the purpose of training this machine learning model, several FPGA designs 203-0 and 203-1, each with a different layout, as well as several quantum control units with different PCBs 201-0 and 201-1 are used for training.

Syncing ports 207-0 and 207-1 in the FPGA 203-0 and/or 203-1 incorporates delay lines 113-0 and 113-1 for each port 207-0 and 207-1. This allows the signal driven from the FPGA 203-0 and/or 203-1 to be programmatically and digitally "shifted," in constant and discrete steps such that all signals are aligned at their destinations as required by the quantum control application.

A machine learning approach is disclosed for syncing all quantum FPGA ports 207-0 and 207-1, without having to save, load and maintain previously acquired data per quantum control unit (i.e., without using external storage). The machine learning approach also eliminates the need for long and repetitive calibrations on the quantum control platform, along with eliminating the need to calibrate using external input/output devices.

To train the machine learning model, information from different PCBs 201-0 and/or 201-1 and different FPGA logic designs 203-0 and/or 203-1 is collected per port 207-0 and 207-1. Training is required only once.

Test signals may be generated by generator 205-0 and 205-1. The test signals may be sinusoidal signals or any other signals with a deterministic phase. For each PCB 201-0 or 201-1, per FPGA design 203-0 or 203-1, the span of possible delays (0 to N) are programmed in the delay lines 113-0 and 113-1. The phase of the test signal at each DAC 109-0 and 109-1 is measured. This provides the information of which tap/delay is required for each port 207-0 and 207-1. Test signals at the DACs 109-0 and 109-1 are synchronized when they have the same phase. A formula for determining the tap/delay, as a function of a port's setup and hold time, may be derived from the measured phase values using linear regression. Alternatively, a non-linear equation for determining the tap/delay may be derived to account for delay lines that are non-linear.

Figure 3:
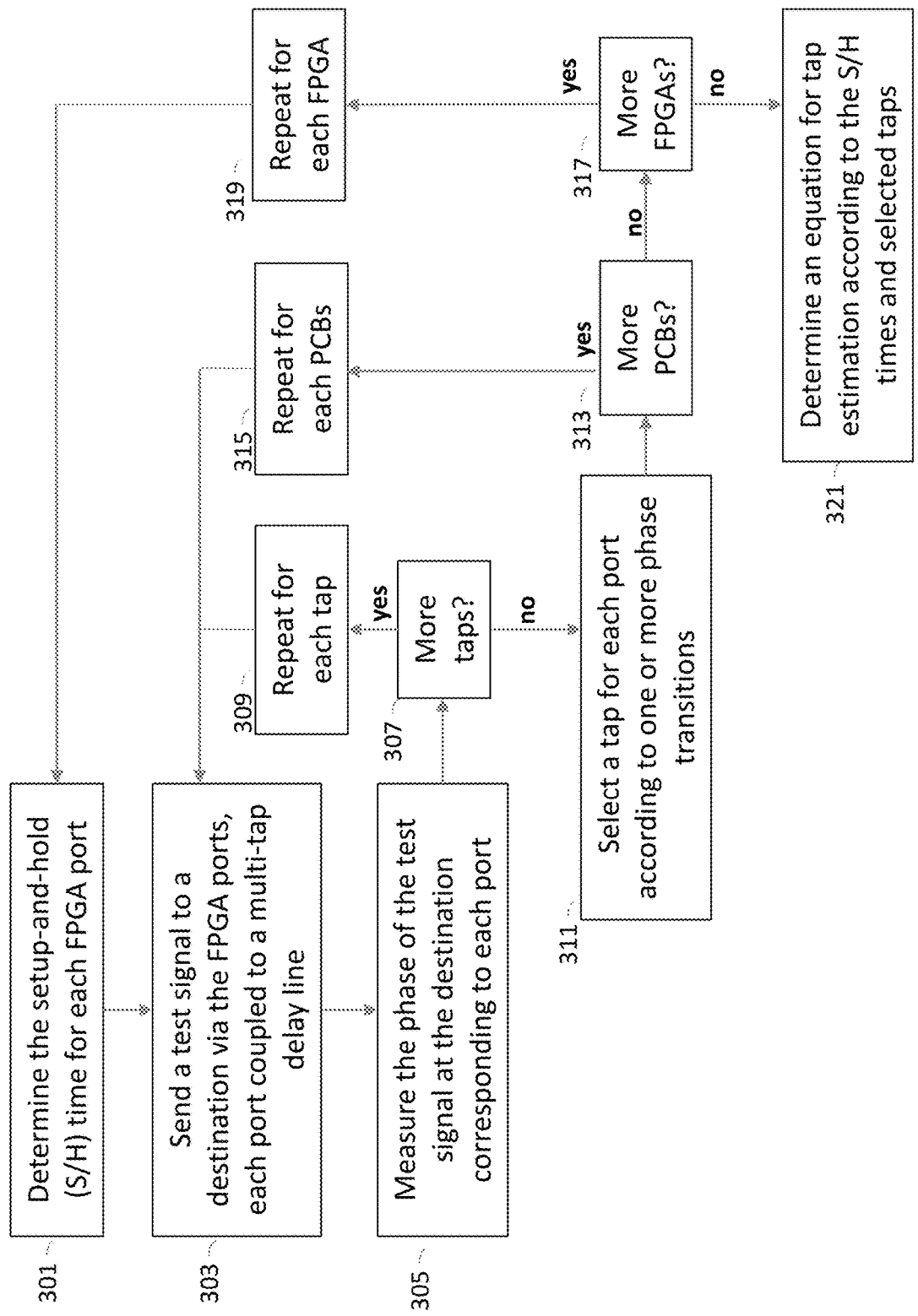
FIG. 3 illustrates a flowchart of an example method for syncing multiple FPGA ports in accordance with various example implementations of this disclosure.

FIG. 3 illustrates a flowchart of an example method for syncing multiple FPGA ports in accordance with various example implementations of this disclosure.

Each of the FPGA logic designs is characterized by setup-and-hold (S/H) times which also serves as part of the input to the training phase. At 301, the S/H times are determined for each port of an FPGA. The FPGA ports may be asynchronous.

A test signal is generated. At 303, the test signal is sent, via each of the FPGA ports, to a destination. The destination may be a DAC. Each FPGA port is coupled to a multi-tap delay line. Each of the plurality of multi-tap delay lines is initiated by setting a tap (i.e., a selectable delay).

At 305, a phase of the test signal, as received at the destination from every port, is measured. For example, if each of 8 ports sends a sinusoidal test signal to each of 8 DACs, the test signals, received at each DAC, are processed to determine the phase values.

At 307, it is determined whether all taps have been used. If more taps are available, at 309, the next tap is chosen, the test signal is resent at 303 and the phase values of the test signal, as received at the destination from every port, is measured at 305.

Once each tap/delay is chosen and the data collection stage is done, an application is operable, at 311, to select an ideal tap/delay, from the plurality of phase values, for each of the plurality of ports. The ideal tap/delay for every ports will correspond to the same phase.

At 313, it is determined whether more PCBs are available for training. If more PCBs are available, at 315, a new PCB is used, the tap/delay is reinitialized for each delay line, the test signal is resent at 303 and the phase values of the test signal, as received at the destination from every port, is measured at 305.

At 317, it is determined whether more FPGAs are available for training. If more FPGAs are available, at 319, a new FPGA is used, the tap/delay is reinitialized for each delay line, the test signal is resent at 303 and the phase values of the test signal, as received at the destination from every port, is measured at 305.

Figure 4:
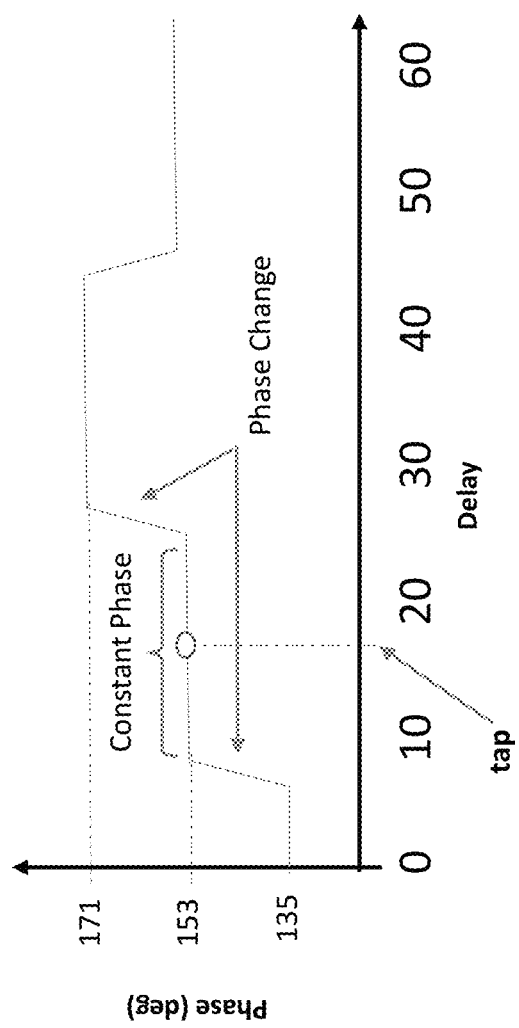
FIG. 4 illustrates an example graph of phase values measured over a range of delays in accordance with various example implementations of this disclosure.

FIG. 4 illustrates an example graph of phase values measured over a range of delays in accordance with various example implementations of this disclosure.

The horizontal axis is the delay-line value (i.e., the amount of time units the test signal is delayed). The vertical axis is the measured phase. A graph like this can be generated for each port.

As illustrated, the tap setting in each delay line may be from 0 to 63. This range is an example, as any range may be used. Ideally, each tap would correspond to an exact delay. For example, a range of 0 to 4 nsec with a 62.5 psec resolution. However, an exact delay is sometimes not possible, and a linear relationship between time and taps is not a requirement for this method.

As illustrated, the test signal is a sinusoidal wave, although any test signal with a deterministic phase may be used. The ideal tap/delay is selected as 18, as 18 corresponds to center of a period of constant phase. The selected ideal tap, for a particular port of the plurality of asynchronous ports, may, therefore, be determined according to a point halfway between 2 phase changes. In other embodiments, the test signal may comprises a pulse. For a test signal pulse, the selected ideal tap, may be based on a phase transition (i.e., on to off or vice versa).

Turning back now to FIG. 3, at 321, a tap estimate function is generated according to the selected/ideal taps, as well as a setup-and-hold time, for each of the plurality of ports.

Figure 5:
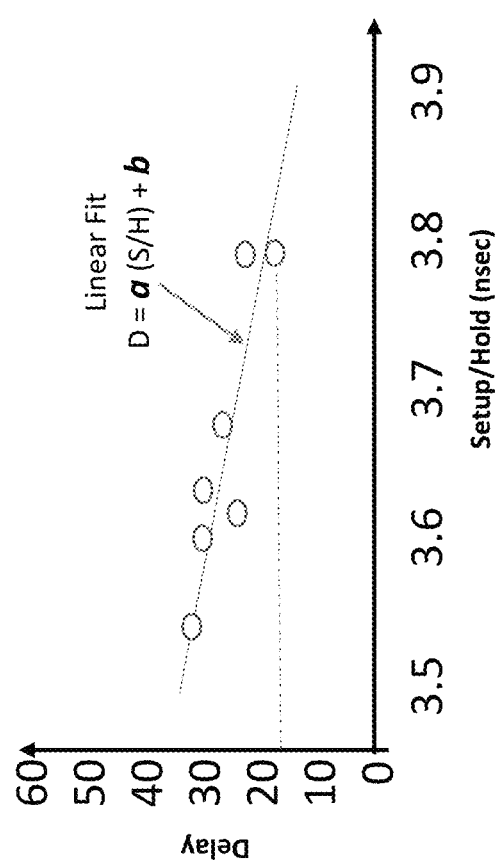
FIG. 5 illustrates an example tap/delay estimate function as a linear fit to the ideal phase values for different ports having different setup-and-hold times in accordance with various example implementations of this disclosure.

FIG. 5 illustrates an example tap/delay estimate function as a linear fit to the ideal phase values (as discussed regarding FIG. 4) for different ports having different setup-and-hold times in accordance with various example implementations of this disclosure.

Using linear regression on the training data, coefficients a and b may be determined such that the following function fits the collected data:

$$Delay = a(S/H) + b$$

where S/H is the setup-and-hold time of a port (this can change per FPGA logic design), and Delay is the required delay for the port, such that all ports in a specific PCB are synchronized.

This machine learning approach may determine an optimal delay for different logic designs, different PVT, different batches of FPGA chips. This optimal delay may achieved without repeated calibration using external wiring and persistent storage.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A method comprising:
    setting a tap, of a plurality of taps, for each of a plurality of multi-tap delay lines;
    sending a test signal, via each of a plurality of asynchronous ports, to a destination, wherein each of the plurality of asynchronous ports is operably coupled to a multi-tap delay line of the plurality of multi-tap delay lines;
    measuring a phase of the test signal at the destination corresponding to each of the plurality of asynchronous ports;
    repeating the phase measurement after setting each tap of the plurality of taps;
    selecting one tap, for each of the plurality of asynchronous ports, according to phase measurements for each of the plurality of asynchronous ports; and
    generating a tap estimate function according to selected taps for the plurality of asynchronous ports.

2. The method of claim 1, wherein the tap estimate function is generated according to a setup-and-hold time for each of the plurality of asynchronous ports.

3. The method of claim 1, wherein a field programmable gate array (FPGA) comprises the plurality of asynchronous ports.

4. The method of claim 3, wherein the FPGA comprises the plurality of multi-tap delay lines.

5. The method of claim 3, wherein the tap estimate function is generated according to phase measurements from a plurality of FPGAs.

6. The method of claim 1, wherein the destination comprises one or more digital-to-analog converters (DACs).

7. The method of claim 1, wherein the test signal is a sinusoidal wave.

8. The method of claim 1, wherein the test signal comprises a pulse.

9. The method of claim 1, wherein the selected tap, for a particular port of the plurality of asynchronous ports, corresponds to a period of constant phase.

10. The method of claim 1, wherein the selected tap, for a particular port of the plurality of asynchronous ports, is determined according to one or more phase changes.

11. A system comprising:
    a signal generator operable to generate a test signal;
    a plurality of multi-tap delay lines operable to receive the test signal, wherein each multi-tap delay line is operable to output a delayed test signal corresponding to a tap of a plurality of taps;
    a plurality of asynchronous ports, wherein each asynchronous port is operable to send delayed test signals to a destination; and
    an application for generating a tap estimate function, wherein:
        for each of the plurality of asynchronous ports, the application is operable to measure a plurality of phase values, the plurality of phase values corresponding the plurality of taps,
        for each of the plurality of asynchronous ports, the application is operable to select the tap from the plurality of phase values, and
        the tap estimate function is generated according to selected taps for each of the plurality of asynchronous ports.

12. The system of claim 11, wherein the tap estimate function is generated according to a setup-and-hold time for each of the plurality of asynchronous ports.

13. The system of claim 11, wherein a field programmable gate array (FPGA) comprises the plurality of asynchronous ports.

14. The system of claim 13, wherein the FPGA comprises the plurality of multi-tap delay lines.

15. The system of claim 13, wherein the tap estimate function is generated according to phase measurements from a plurality of FPGAs.

16. The system of claim 11, wherein the destination comprises one or more digital-to-analog converters (DACs).

17. The system of claim 11, wherein the test signal is a sinusoidal wave.

18. The system of claim 11, wherein the test signal comprises a pulse.

19. The system of claim 11, wherein the selected tap, for a particular port of the plurality of asynchronous ports, corresponds to a period of constant phase.

20. The system of claim 11, wherein the selected tap, for a particular port of the plurality of asynchronous ports, is determined according to one or more phase changes.

* * * * *